United States Patent [19]

Sims, Jr.

[11] Patent Number: 5,414,776
[45] Date of Patent: May 9, 1995

[54] ADAPTIVE PROPORTIONAL GAIN AUDIO MIXING SYSTEM

[75] Inventor: Travis M. Sims, Jr., Rio Rancho, N. Mex.

[73] Assignee: Lectrosonics, Inc., Rio Rancho, N. Mex.

[21] Appl. No.: 62,430

[22] Filed: May 13, 1993

[51] Int. Cl.⁶ .............................................. H04B 1/00
[52] U.S. Cl. ...................................... 381/119; 381/92; 381/94; 379/202
[58] Field of Search ................... 381/119, 92, 94, 107, 381/108, 57; 379/202, 389, 390

[56] References Cited

U.S. PATENT DOCUMENTS

| | | |
|---|---|---|
| 3,814,856 | 6/1974 | Dugan . |
| 3,992,584 | 11/1976 | Dugan . |
| 4,090,032 | 5/1978 | Schrader . |
| 4,149,032 | 4/1979 | Peters . |
| 4,374,300 | 2/1983 | Ponto et al. . |
| 4,466,119 | 8/1984 | Peters et al. .................. 381/108 |
| 4,489,442 | 12/1984 | Anderson et al. . |

*Primary Examiner*—Forester W. Isen
*Assistant Examiner*—Mark Kelly
*Attorney, Agent, or Firm*—McCubbrey, Bartels & Ward

[57] ABSTRACT

An improved audio mixing system that does not instantaneously switch a microphone from the attenuated level to the unattenuated level in response to level changes on the microphone is disclosed. The system is not limited to one type of microphone and does not depend on separate sensing microphones to determine the background noise level. In addition, the active signal is not amplitude modulated by extraneous noise inputted through inactive microphones.

5 Claims, 3 Drawing Sheets

ADAPTIVE PROPORTIONAL GAIN AUDIO MIXING SYSTEM

FIELD OF THE INVENTION

The present invention relates to audio mixing systems, and more particularly, to electronic systems for controlling audio sound reinforcement systems employing multiple microphones, as might be found in conference rooms, churches, auditoriums, and the like.

BACKGROUND OF THE INVENTION

Consider a conference room in which a number of talkers, each with a separate microphone, are to speak. If all of the microphones are allowed to be active at the same time, problems associated with feedback and extraneous noise pickup arise. Each active microphone that is not actually being used picks up the amplified sounds from the microphone that is being used by the current talker. As a result, the amount of amplification available to the talker's microphone must be reduced to prevent feedback. In addition, each active microphone acts as a noise source that further reduces the quality of the audio from the microphone that is actually being used by the current talker. Finally, destructive interference from reinforced sound recirculated through the sound system from multiple open microphones (commonly known as "comb filtering") can cause serious aberrations in the system frequency response.

To avoid these problems, a number of prior art systems have been devised to activate only those microphones in which there exists some desired signal. One class of prior art system uses the sound level at each microphone to determine whether that microphone should be on or off. Some of the systems (e.g. Scrader, U.S. Pat. No. 4,090,032, Peters, U.S. Pat. No. 4,149,032, and Ponto and Martin, U.S. Pat. No. 4,374,300) compare the instantaneous signal level at any microphone to a reference. If the microphone level exceeds the reference level, the microphone is assumed to have a desired signal and is turned on. Systems of this type typically modulate the reference in some manner that is proportional to the current active signal level to prevent other microphones from coming on as a result of pickup of sound from the system loudspeakers. Often, systems of this type change the attenuation level of the microphone channel from the off state to the on state in an instantaneous manner, which can give rise to audible switching transients not harmonically related to the audio signal. In addition, a single initial value of the reference threshold may not accurately reflect the changes in ambient noise in an acoustic space under varying conditions of use.

Other types of systems (e.g. Anderson, Bevan, Schulein, and Smith, U.S. Pat. No. 4,489,442 and Dugan, U.S. Pat. No. 3,814,856) develop a reference level based on a sensing microphone of some type. In the case of Anderson et al., two directional microphones are placed back-to-back in a common housing. One of the microphones is the system microphone, while the other is the sensing microphone. The system microphone is oriented so as to preferentially pick up the desired sound, while the sensing microphone is oriented to pick up the background sounds. The signal at the system microphone must exceed the level at the sensing microphone by 9.54 dB to activate the system microphone. While this system solves the reference threshold problem, there are still drawbacks. The system again switches from the attenuated level to the unattenuated level instantaneously which leads to the difficulties discussed above. In addition, the system is restricted to the use of only specially manufactured microphones, eliminating the choice of other microphones whose characteristics might be better suited to the particular application.

The Dugan system, in contrast, uses a single sensing microphone situated in such a way so as to receive a signal that is representative of the ambient noise in the room. The effective threshold for other microphones is proportional to the instantaneous signal value at the sensing microphone. Also, rather than changing channel gain in an instantaneous manner, the shift from fully attenuated to fully on happens over a 10 dB range above threshold. This is accomplished via 2:1 expansion, i.e. for every 1 dB that the microphone signal exceeds the threshold, channel gain increases 1 dB up to a total of 10 dB gain change, at which time the channel reaches unity gain. Difficulties in the use of this system arise in finding an appropriate place for the sensing microphone that accurately reflects the ambient noise in the entire space. In addition, a localized increase in the ambient noise near the sensing microphone can prevent activation of microphones which have desired signals.

In another system (Dugan, U.S. Pat. No. 3,992,584), a comparison is made of the level at each microphone preamp to the level of the overall mixed signal. Each channel is attenuated by an amount that depends on the difference between the two levels. For instance, if one microphone were active, the level of that microphone and the level of the overall mix would be equal (i.e. a difference of 0 dB), so that the channel would not be attenuated. All other channels would be very much attenuated because of the large difference between the mix level and the level of an inactive microphone. If two microphones are active at the same level, the mix level (assuming no correlation between the two inputs) will be 3 dB higher than either active input. Thus, both microphones would be attenuated by 3 dB (and again inactive microphones would be greatly attenuated as before). The drawback to the Dugan scheme is that extraneous noise (whether recirculated signal from the sound system or other noise) at "inactive" microphones will compete with the active microphone for system gain. In this way, the "active" signal is amplitude modulated by the extraneous noise.

Broadly, it is the object of the present invention to provide an improved audio mixing system.

It is a further object of the present invention to provide a mixing system that does not instantaneously switch a microphone from the attenuated level to the unattenuated level in response to level changes on the microphone.

It is a still further object of the present invention to provide a mixing system that is not limited to one type of microphone.

It is yet another object of the present invention to provide a mixing system that does not depend on separate sensing microphones to determine the background noise level.

It is a still further object of the present invention to provide a mixing system in which the active signal is not amplitude modulated by extraneous noise inputted through inactive microphones.

These and other objects of the present invention will become apparent to those skilled in the art from the following detailed description of the invention and the accompanying drawings.

SUMMARY OF THE INVENTION

The present invention is an audio mixing system for combining a plurality of input signals to generate a mixed signal. The mixing system includes a plurality of input channels. Each input channel includes an input circuit receiving an input signal, and a variable attenuator for generating an attenuated signal from the input signal. The output signal is obtained by combining the attenuated signals. The level of attenuation applied to each channel is determined by the average values of the input signals and the attenuated signals over a first predetermined time interval. In one embodiment of the present invention, the attenuation levels are set by generating a channel signal corresponding to each input channel, the channel signal depending on the input signal received by the channel and the attenuated signal generated by said input channel. The ratio of the channel signal for a given channel to the sum of the channel signals for all channels is used to set the attenuation for the channel in question in this embodiment.

DETAILED DESCRIPTION OF THE INVENTION

Figure 1:
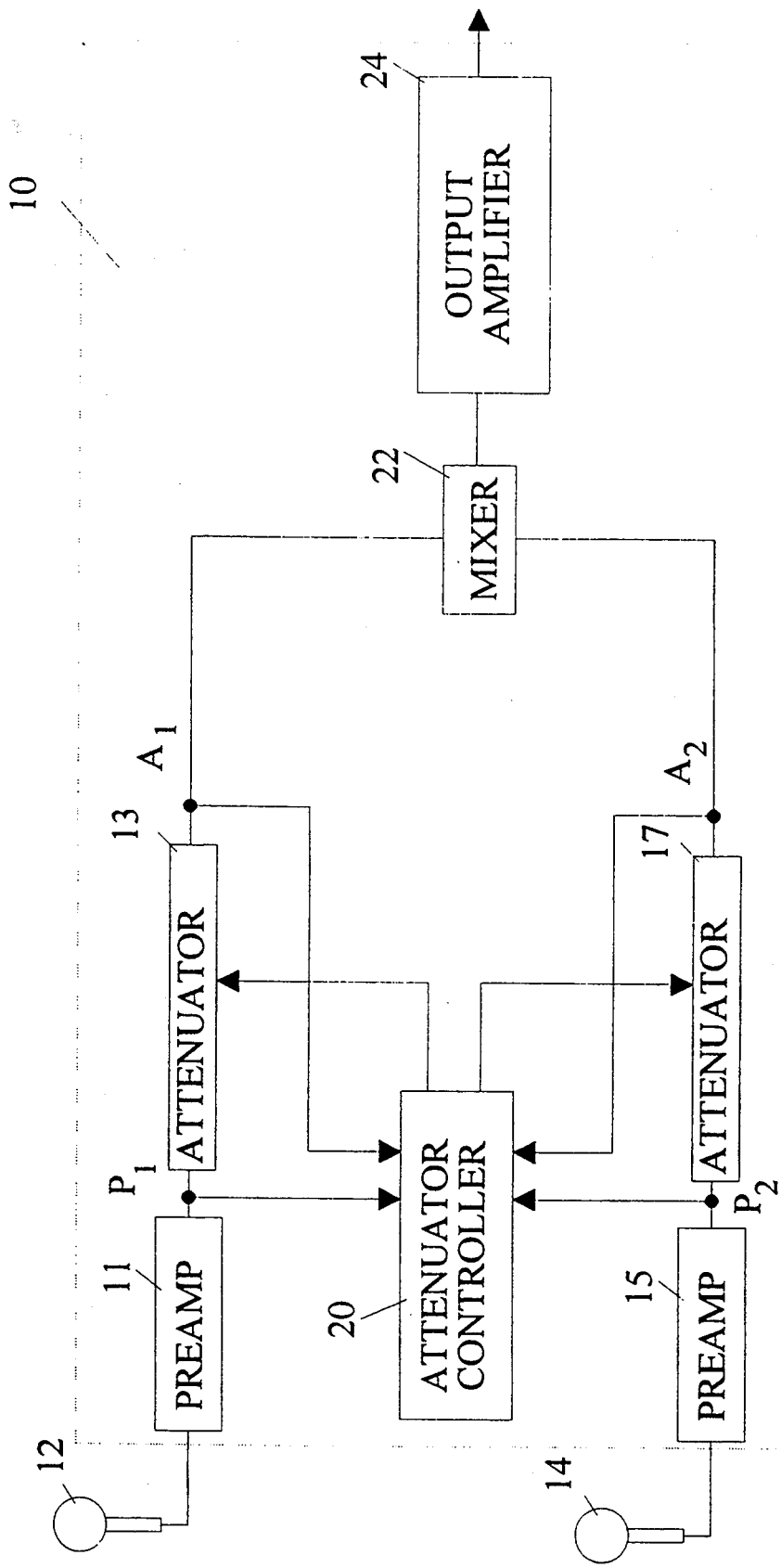
FIG. 1 is a block diagram of a two channel audio mixing circuit according to the present invention.

Refer now to FIG. 1 which is a block diagram of a two channel audio mixing circuit 10 according to the present invention. The first channel includes a preamp 11 and attenuator 13 for amplifying the output of a first microphone 12. The second channel includes a preamp 15 and attenuator 17 for amplifying the output of a second microphone 14. The outputs of attenuators 13 and 17 are input to a mixer 22 which feeds output amplifier 24. Mixer 22 adds the outputs of attenuators 13 and 17 in a fixed ratio. The amount of attenuation applied by attenuators 13 and 17 is determined by controller 20 which senses the output of preamps 11 and 15 as well as attenuators 13 and 17. Denote the average output of preamp 11 by $P_1$ and the average output of preamp 15 by $P_2$. The manner in which the "average" output of each preamp is generated will be discussed in more detail below.

In prior art systems such as that taught by the Dugan '584 patent, the gain of attenuator 13 would be set proportionally to $\log_{10}[P_1/(P_1+P_2)]$. As noted above, if microphone 12 is active and microphone 14 inactive, noise on microphone 14 results in modulation of the output of the channel connected to microphone 12, since the gain of attenuator 13 decreases if $P_2$ increases due to any sound source, including noise. For example, consider the case in which a noise signal on the second channel is 50% of the signal on the first channel. The quantity $[P_1/(P_1+P_2)]$ can change by approximately 40% in this case. The exact amount depends on the correlation between the signals on the two channels. This change is sufficient to generate a modulation in the gain that is easily detected by a human listener.

The present invention substantially reduces the modulation problem, and provides other useful features. In the preferred embodiment of the present invention, each channel's gain is determined by the ratio of a channel signal associated with the channel and the sum of all of the channel signals. Unlike the prior art system discussed above, the channel signal depends on whether or not the channel is currently active. In the present invention, the channel signal for an active channel is substantially greater than that for an inactive channel having the same microphone input signal. In the preferred embodiment of the present invention, the channel signal is a mixture of the preamplified microphone signal and the post-attenuator microphone signal. Denote the average post-attenuator 13 signal by $A_1$ and the average post-attenuator 17 signal by $A_2$. In the preferred embodiment of the present invention, controller 20 sets the level of attenuator 13 to $L_1$ where $$L_1 = 20\log_{10}\left[\frac{P_1^*(1-x) + A_1^*x}{S_t}\right]$$

and the level of attenuator 17 to $L_2$ where $$L_2 = 20\log_{10}\left[\frac{P_2^*(1-x) + A_2^*x}{S_t}\right]$$

Here, $$S_t = P_1^*(1-x_1) + A_1^*x_1 + P_2^*(1-x_2) + A_2^*x_2$$

where $x_1$ and $x_2$ may have values from 0 to 1 inclusive. For the moment, assume that $x_1=x_2=x$. Consider the case in which the channel servicing microphone 12 is on and the other channel is inactive. In this case, the gain of attenuator 13 is nearly unity and that of attenuator 17 is approximately zero. As a result, $$P_1 = A_1$$

independent of the value of x, $$A_2 \approx 0.$$

$$L_1 = 20\log_{10}\left[\frac{P_1}{S_t}\right]$$

$$L_2 = 20\log_{10}\left[\frac{P_2^*(1-x)}{S_t}\right]$$

and $$S_t = P_1 + P_2^*(1-x)$$

As a result, an inactive channel would have to be $20_{log10}(1-x)$ dB higher in level than the active channel to gain equal access to the system (or substantially modulate the amplitude of the active microphone). This is an improvement of $20_{log10}(1-x)$ dB in modulation rejection relative to the Dugan (U.S. Pat. No. 3,992,584) system. It should be noted that as x is varied from 0 to 1 the immunity to unwanted amplitude modulation is increased.

Figure 2:
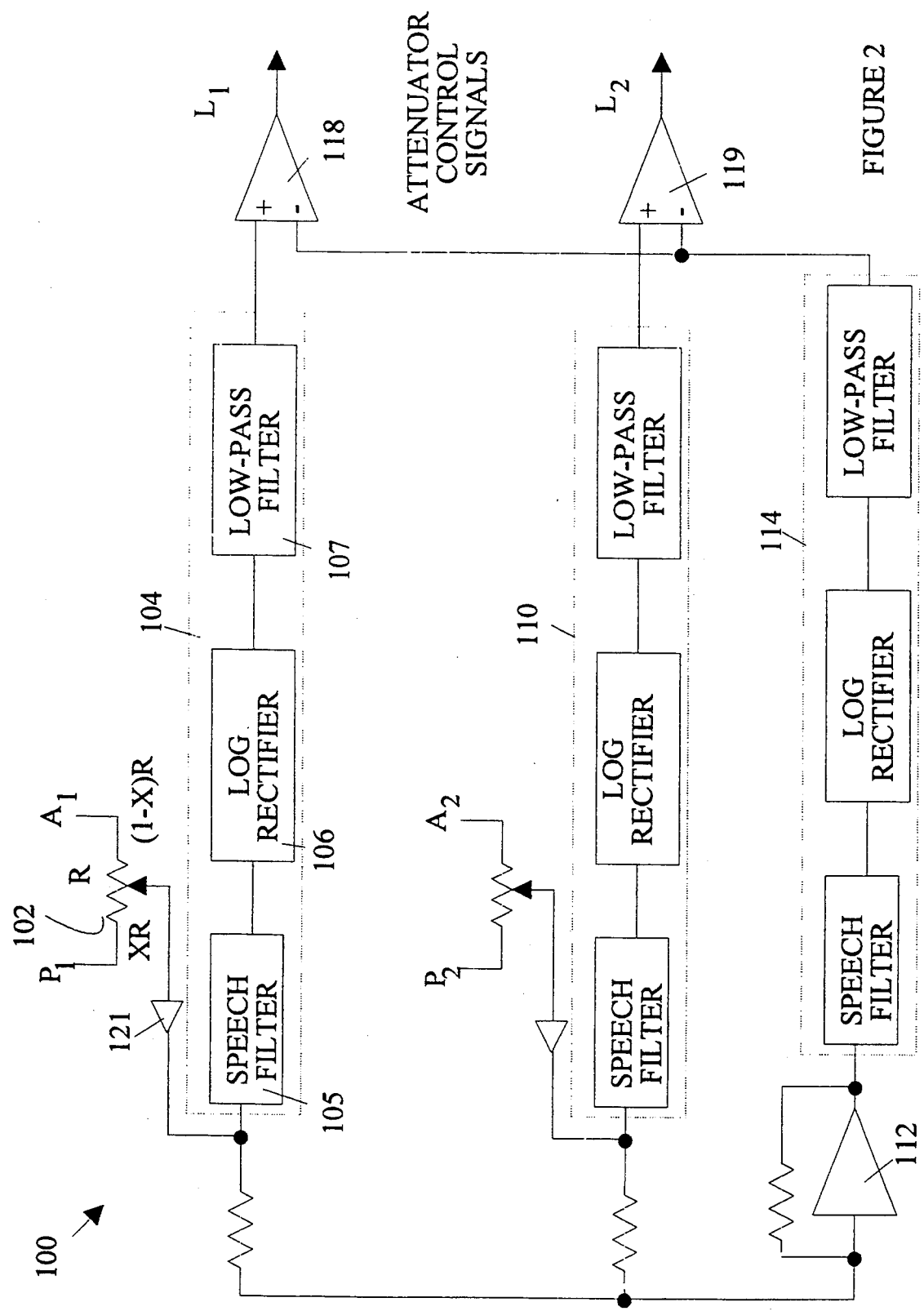
FIG. 2 is a block diagram of the preferred embodiment of an attenuator controller according to the present invention.

The above-described controller must compute a number of signal averages. An analog circuit embodiment of the attenuator controller used in the preferred embodiment of the present invention is shown in FIG. 2 at 100. Controller 100 includes two circuits for generating the logarithms of numerators of $L_1$ and $L_2$, respectively, and a circuit for generating log ($S_t$). $L_1$ and $L_2$ are then generated by subtracting the relevant logarithmic signals using amplifiers 118 and 119. The manner in which the logarithm of the numerator of $L_1$ is generated will now be explained. Variable resistor 102 determines the value of x. If x is the fraction of the resistor between $P_1$ and the center tap, the potential at the center tap of this resistor will be proportional to $P_1(1-x)+A_1x$. A buffer 121 having unity gain is provided to isolate the variable resistors in the two channels. This signal is filtered by speech filter 105 to improve noise rejection. The output of filter 105 is input to a rectifier circuit whose output is the logarithm of the output of filter 105. The average value of this signal is then generated by low-pass filter 107.

Figure 3:
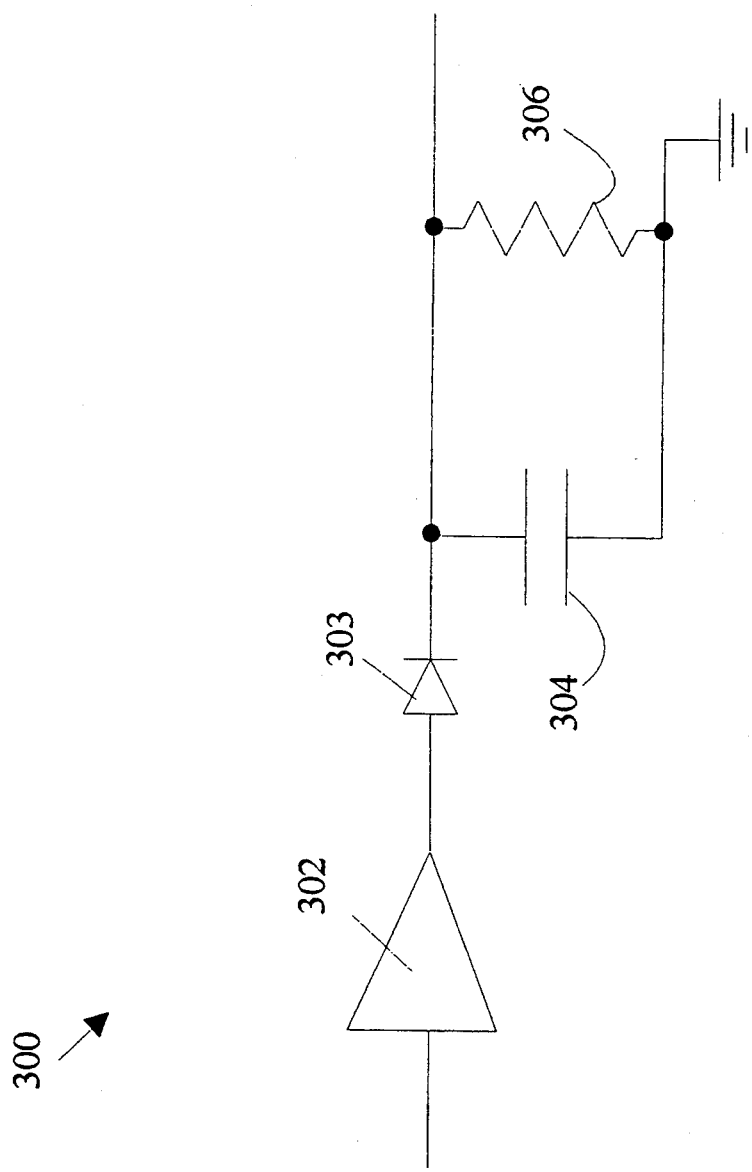
FIG. 3 is a block diagram of one embodiment of a low-pass filter according to the present invention.

The time interval over which the averaging takes place is determined by the cut-off of low-pass filter 107. The output of low-pass filter 107 preferably tracks the voice envelope of the person speaking while removing any ripple resulting from the fundamental frequency. Such a filter can be constructed from a buffer amplifier 302, a rectifier 303, a capacitor 304, and a resistor 306 as shown in FIG. 3 at 300. Capacitor 304 is charged by buffer amplifier 302 which has sufficient current driving capacity to follow the risetime of a talker's voice and still drive capacitor 304. Rectifier 303 prevents the charge stored on capacitor 304 from leaving via amplifier 302. Capacitor 304 and resistor 306 are chosen such that any ripple from the lowest anticipated fundamental frequency of the voiced speech is removed from the signal. This arrangement provides a "fast attack"-"slow release" filter. The fast attack characteristic assures that the initial syllables uttered by the talker are not lost.

The logarithm of the numerator of $L_2$ is generated in an analogous manner by circuit 110. The average of the logarithm of the sum of the numerators of $L_1$ and $L_2$ is generated by amplifier 112 and circuit 114. Circuit 114 operates in a manner analogous to circuit 104 described above. The output of circuit 114 is the logarithm of the denominator of $L_1$ and $L_2$. Difference amplifiers 118 and 119 compute the difference of the logarithms of the numerators and the denominators of $L_1$ and $L_2$, respectively. The output of these difference amplifiers is logarithm of $L_1$ and $L_2$.

While the above-described embodiments of the present invention have been described in terms of a mixing system having two channels, it will be apparent to those skilled in the art that these embodiments may be generalized to systems having N channels, where N is any integer greater than 1. In this case, the attenuator in the $i_{Th}$ channel has a level, $L_1$, given by $$L_i = 20\log_{10}\left[\frac{P_i^*(1-x_i) + A_i^*x_i}{S_t}\right]$$

where $$S_t = \sum_{i=1}^{N} [P_i^*(1-x_i) + A_i^*x_i]$$

An additional benefit provided by the present invention is "continuously variable priority". As noted above, the constant x may be different for different channels. Consider the case in which x is in the midposition (i.e. x=0.5) for all but one microphone channel. Then, if this microphone has x set closer to the preamp signal, (i.e. x<0.5), this channel will have easier access to the system and also cause more attenuation of other channels, since it will be less affected by the signals on the other channels. It will be apparent from the preceding discussion that multiple levels of "continuous priority" can be set using different settings of the microphone contribution for each channel.

It will be apparent to those skilled in the an that the identity of the channel having priority may be changed automatically in response to the usage patterns of the system. That is, the value of x used in setting the attenuation level on a given channel can be changed in response to the average value of the output of the channel. Here, the time over which the average is taken would be substantially longer than that used in generating the channel signal. Alternatively, the values of x in the various channels can be set manually by the operator of the mixing console. In this way, priority could be skewed towards the currently active microphone, further improving the modulation immunity of the system. This feature is particularly helpful for systems whose normal use is a single talker at a time.

The above embodiments of the present invention have been described in terms of a particular form of channel signal and a controller that utilizes the ratio of the channel signal to the sum of the channel signals to determine the gain of each channel. However, it will be apparent to those skilled in the art that other forms of channel signals and other methods of combining the channel signals to determine the channel gain may be used. In the case of a ratio based system, any channel signal that is greater than the channel's audio input signal for an active channel and less than the channel's audio input signal for an inactive channel will provide improvements over the prior art. Here, the channel's "audio input signal" may be any signal that is proportional to the output of the microphone connected to the channel in question.

While the above-described embodiments of the present invention have utilized preamplifiers to generate the input signals to the attenuators, it will be obvious to those skilled in the art that the preamplifiers can be included in the microphones without departing from the teachings of the present invention.

Various modifications to the present invention will become apparent to those skilled in the art from the foregoing description and accompanying drawings. Accordingly, the present invention is to be limited solely by the scope of the following claims.

What is claimed is:

1. An audio mixing system comprising:
   a plurality of input channels, each said input channel comprising means for receiving an input signal; and means for generating an attenuated signal from said input signal, the degree of attenuation being specified by a channel control signal;
   means for combining all of said attenuated signals to form an output signal; and
   control means for generating each of said channel control signals in response to both a respective input signal for each channel and a function generated from all of said input signals and all of said attenuated signals.

2. The mixing system of claim 1 wherein said control means comprises:

means for generating a channel signal corresponding to each said input channel, said channel signal depending on said input signal received by said channel and said attenuated signal generated by said input channel;

means for generating a sum signal having a value determined by the sum of said channel signals; and means for generating a channel control signal for each said input channel, said channel control signal for a given input channel being determined by said channel signal corresponding to said input channel and said sum signal.

3. An audio mixing system comprising:

a plurality of input channels, each said input channel comprising means for receiving an input signal; and means for generating an attenuated signal from said input signal, the degree of attenuation being specified by a channel control signal;

means for combining all of said attenuated signals to form an output signal; and control means for generating said channel control signals, said control means being responsive to the average value of each of said input signals and the average value of each of said attenuated signals, each said average being determined over a first predetermined time interval, wherein said control means further comprises:

means for generating a channel signal corresponding to each said input channel, said channel signal depending on said input signal received by said channel and said attenuated signal generated by said input channel;

means for generating a sum signal having a value determined by the sum of said channel signals; and means for generating a channel control signal for each said input channel, said channel control signal for a given input chapel being determined by said channel signal corresponding to said input channel and said sum signal, and wherein one of said channel signals has an amplitude determined by $P*(1-x)+A*x$, where P is said input signal to said input channel, A is said attenuated signal generated by said input channel, and $0<x<1$.

4. The mixing system of claim 3 where x is determined by the average value of A over a second predetermined time interval.

5. The mixing system of claim 3 wherein said control means further comprises means for receiving signals specifying the value of x.

* * * * *